United States Patent
Li et al.

(10) Patent No.: US 12,094,704 B2
(45) Date of Patent: Sep. 17, 2024

(54) SEMICONDUCTOR DEVICE AND METHOD OF FABRICATING THE SAME

(71) Applicant: WUHAN XINXIN SEMICONDUCTOR MANUFACTURING CO., LTD., Hubei (CN)

(72) Inventors: Le Li, Hubei (CN); Jun Zhou, Hubei (CN); Sheng Hu, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 197 days.

(21) Appl. No.: 17/646,658

(22) Filed: Dec. 30, 2021

(65) Prior Publication Data

US 2022/0415644 A1    Dec. 29, 2022

(30) Foreign Application Priority Data

Jun. 25, 2021 (CN) .......................... 202110710741.9

(51) Int. Cl.
*H01L 21/02* (2006.01)
*H01L 27/12* (2006.01)

(52) U.S. Cl.
CPC .. *H01L 21/02016* (2013.01); *H01L 21/02019* (2013.01); *H01L 27/1203* (2013.01)

(58) Field of Classification Search
CPC ......... H01L 21/02016; H01L 21/02019; H01L 27/1203; H01L 21/7806; H01L 23/66; H01L 21/76256
See application file for complete search history.

(56) References Cited

U.S. PATENT DOCUMENTS

| | | | |
|---|---|---|---|
| 2004/0241958 A1* | 12/2004 | Guarini | ............ H01L 21/76254 438/455 |
| 2015/0130015 A1 | 5/2015 | Motoyama et al. | |
| 2018/0158721 A1 | 6/2018 | Libbert et al. | |

(Continued)

FOREIGN PATENT DOCUMENTS

| | | | |
|---|---|---|---|
| CN | 103077949 A | 5/2013 | |
| CN | 103296013 A | 9/2013 | |

(Continued)

*Primary Examiner* — Cuong B Nguyen
(74) *Attorney, Agent, or Firm* — MUNCY, GEISSLER, OLDS & LOWE, PC

(57) ABSTRACT

A semiconductor device and a method of fabricating the semiconductor device are disclosed. The method includes: providing a device wafer and a carrier wafer, the device wafer including an SOI substrate comprising, stacked from the bottom upward, a lower substrate, a buried insulator layer and a semiconductor layer; bonding the device wafer at a front side thereof to the carrier wafer; removing at least the lower substrate through thinning the device wafer from a backside thereof, wherein the backside of the device wafer opposes the front side thereof; and providing a high-resistance substrate and bonding the device wafer at the backside thereof to the high-resistance substrate, the high-resistance substrate having a resistivity higher than that of the lower substrate. With the present disclosure, lower signal loss and improved signal linearity can be achieved while avoiding a significant cost increase.

9 Claims, 4 Drawing Sheets

(56) References Cited

U.S. PATENT DOCUMENTS

2019/0304831 A1* 10/2019 Shih .................... C04B 37/003
2020/0058746 A1    2/2020 Wu et al.
2022/0375787 A1* 11/2022 Lei ......................... H01L 24/19

FOREIGN PATENT DOCUMENTS

| CN | 107785302 A | 3/2018 |
| CN | 107785303 A | 3/2018 |
| CN | 111564368 A | 8/2020 |
| CN | 112490253 A | 3/2021 |

* cited by examiner

SEMICONDUCTOR DEVICE AND METHOD OF FABRICATING THE SAME

CROSS-REFERENCES TO RELATED APPLICATION

This application claims the priority of Chinese patent application number 202110710741.9, filed on Jun. 25, 2021, the entire contents of which are incorporated herein by reference.

TECHNICAL FIELD

The present disclosure relates to the field of semiconductor integrated circuit (IC) fabrication, more particularly to a semiconductor device and a method of fabricating the semiconductor device.

BACKGROUND

Semiconductor-on-insulator (SOI) substrates have been widely used in radio frequency (RF), high voltage, radiation-sensitive and many other applications thanks to a variety of advantages over ordinary semiconductor substrates, such as latch-up elimination, mitigated short-channel effects and enhanced radiation resistance.

Existing SOI substrates used for the fabrication of RF devices are directly purchased from the manufacturers. As shown in FIG. 1a, such purchased SOI substrates include a lower substrate 11, a buried insulator layer 12 and a semiconductor layer 13. The lower substrate typically contains some impurities, which lower the substrate's resistivity (it is costly to purify the substrate). Moreover, since the concentration of the impurities is difficult to control, in order to ensure good consistency of SOI products delivered from the factory, the lower substrate 11 is often doped with a certain concentration of ions to further lower its resistivity, for example, to 8-10 $\Omega \cdot cm$. For an RF device fabricated using such an SOI substrate, for example, when an RF signal in the form of an electromagnetic wave generated by the RF device propagates through the buried insulator layer 12 and reaches the lower substrate 11, it tends to induce a voltage or current, which may lead to signal loss and degraded linearity.

One existing method for obtaining suppressed signal loss and enhanced signal linearity is to use SOI substrates as shown in FIG. 1b, which adds a polysilicon layer 14 between the lower substrate 11 and the buried insulator layer 12, which imparts an increased resistivity to the portion under the buried insulator layer 12 and lowers voltages or currents induced therein, thus resulting in lower signal loss and higher signal linearity. However, the SOI substrates shown in FIG. 1b are far more expensive than the SOI substrates shown in FIG. 1a and will lead to a significant increase in cost.

Therefore, there is an urgent need for a solution capable of lowering signal loss and enhancing signal linearity of RF devices while not causing a significant cost increase.

SUMMARY OF THE INVENTION

It is an objective of the present disclosure to provide a semiconductor device and a method of fabricating the semiconductor device, which enable lowered signal loss and enhanced signal linearity while not causing a significant cost increase.

This objective is attained by a method of fabricating a semiconductor device provided in the present disclosure, which includes:

providing a device wafer and a carrier wafer, the device wafer including a semiconductor-on-insulator (SOI) substrate including, stacked from the bottom upward, a lower substrate, a buried insulator layer and a semiconductor layer;

bonding the device wafer at a front side thereof to the carrier wafer;

removing at least the lower substrate through thinning the device wafer from a backside thereof, wherein the backside of the device wafer opposes the front side thereof; and providing a high-resistance substrate and bonding the device wafer at the backside thereof to the high-resistance substrate, the high-resistance substrate having a resistivity higher than that of the lower substrate.

Optionally, the resistivity of the lower substrate may range from 8 $\Omega \cdot cm$ to 10 $\Omega \cdot cm$.

Optionally, as a result of the backside thinning of the device wafer, the lower substrate may be removed. Alternatively, the lower substrate and at least a partial thickness of the buried insulator layer may be both removed.

Optionally, the high-resistance substrate may be formed of a semiconductor material, and the resistivity of the high-resistance substrate may be 100 $\Omega \cdot cm$ or higher.

Optionally, the high-resistance substrate may be formed of an insulating material.

Optionally, a polysilicon layer may be formed on the high-resistance substrate, and the device wafer may be bonded at its backside to the polysilicon layer.

Optionally, the method may further include removing the carrier wafer using a debonding process.

Optionally, the bonding of the device wafer at a front side thereof to the carrier wafer may be accomplished with a bonding adhesive.

Optionally, before the device wafer is bonded at the front side thereof to the carrier wafer, a first bonding layer may be formed on the device wafer, and/or a second bonding layer may be formed on the carrier wafer, the bonding of the device wafer to the carrier wafer may be accomplished by means of the first bonding layer and/or the second bonding layer.

Optionally, the thinning of the device wafer may be accomplished with at least one of chemical mechanical polishing, dry etching and wet etching.

Optionally, before the device wafer is bonded at the backside thereof to the high-resistance substrate, bonding layers may be formed on the backside of the device wafer and on the high-resistance substrate, or a bonding layer may be formed on the backside of the device wafer or on the high-resistance substrate, the bonding of the device wafer at the backside thereof to the high-resistance substrate is accomplished by the bonding layer(s).

Optionally, the high-resistance substrate may be formed of an insulating material including glass, quartz, sapphire or aluminum nitride.

The above object is also attained by a semiconductor device provided in the present disclosure, which includes:

a high-resistance substrate with a high resistivity;

a device wafer bonded to the high-resistance substrate, the device wafer including a semiconductor layer and optionally a buried insulator layer located closer to the high-resistance substrate than the semiconductor layer, wherein the resistivity of the high-resistance substrate is 100 $\Omega \cdot cm$ or higher.

Optionally, the high-resistance substrate may be made of a semiconductor material or of an insulating material.

Optionally, in the case of the high-resistance substrate being made of a semiconductor material, a polysilicon layer may be formed on the high-resistance substrate so as to be sandwiched between the high-resistance substrate and the device wafer.

Optionally, the semiconductor device may further include a carrier wafer bonded to the device wafer.

Optionally, the high-resistance substrate may be formed of an insulating material including glass, quartz, sapphire or aluminum nitride.

Compared to the prior art, the present disclosure has the following advantages:

1. In the provided method, the device wafer is temporarily bonded at its front side to the carrier wafer and then thinned from the backside thereof to remove at least the lower substrate of the SOI substrate. Moreover, the device wafer is bonded at its backside to the high-resistance substrate. In this way, the lower substrate of the SOI substrate is replaced with the high-resistance substrate with a higher resistivity. Therefore, when the semiconductor device is an RF device, when RF signals that it produces in the form of electromagnetic waves propagate to the high-resistance substrate, weaker voltages or currents will be induced. In this way, reduced signal loss and improved signal linearity are achievable with the less expensive SOI substrate containing only the lower substrate, the buried insulator layer and the semiconductor layer, dispensing with the need to use a more expensive SOI substrate additionally including a polysilicon layer in addition to the lower substrate, the buried insulator layer and the semiconductor layer, i.e., avoiding a significant cost increase. Thus, the method can achieve lower signal loss and improved signal linearity of an RF device while avoiding a significant cost increase.

2. In the provided semiconductor device, since the device wafer is bonded to the high-resistance substrate having a high resistivity, when the semiconductor device is an RF device, weaker voltages or currents will be induced in the high-resistance substrate by RF signals that the RF device produces in the form of electromagnetic waves. In this way, reduced signal loss and improved signal linearity are achievable.

BRIEF DESCRIPTION OF THE DRAWINGS

In FIGS. 1a to 3i,

11—lower substrate; 12—buried insulator layer; 13—semiconductor layer; 14—polysilicon layer; 21—lower substrate; 22—buried insulator layer; 23—semiconductor layer; 24—insulating dielectric layer; 241—metal interconnection; 25—carrier wafer; 26—high-resistance substrate; 27—polysilicon layer.

DETAILED DESCRIPTION

Objectives, advantages and features of the present disclosure will become more apparent from the following detailed description of the proposed semiconductor device and method, which is to be read in connection with the accompanying drawings. Note that the figures are provided in a very simplified form not necessarily drawn to exact scale for the only purpose of helping to explain the embodiments disclosed herein in a more convenient and clearer way.

Figure 2:
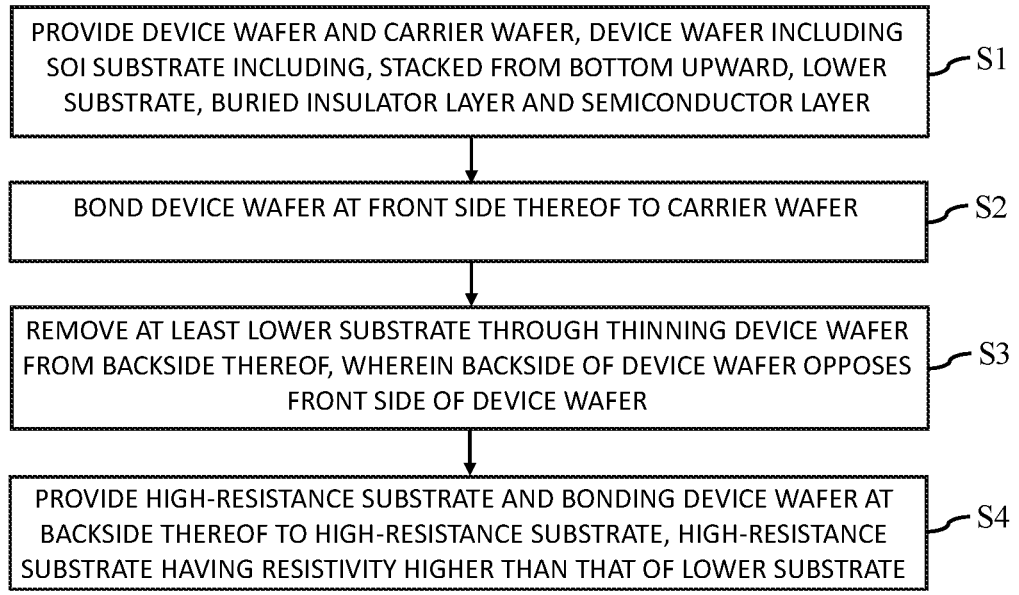
FIG. 2 is a flowchart of a method of fabricating a semiconductor device according to an embodiment of the present disclosure.

In embodiments of the present disclosure, there is provided a method of fabricating a semiconductor device. FIG. 2 is a flowchart of the method according to an embodiment of the present disclosure. As shown, the method includes the steps of:

S1) providing a device wafer and a carrier wafer, the device wafer including a semiconductor-on-insulator (SOI) substrate including, stacked from the bottom upward, a lower substrate, a buried insulator layer and a semiconductor layer;

S2) bonding the device wafer at a front side thereof to the carrier wafer;

S3) removing at least the lower substrate by thinning the device wafer from a backside thereof, wherein the backside of the device wafer opposes the front side of the device wafer; and S4) providing a high-resistance substrate with a resistivity higher than that of the lower substrate and bonding the device wafer at the backside thereof to the high-resistance substrate.

The method according to this embodiment will be described in greater detail below with reference to the schematic longitudinal cross-sectional views shown in FIGS. 3a to 3i.

Figure 3A:
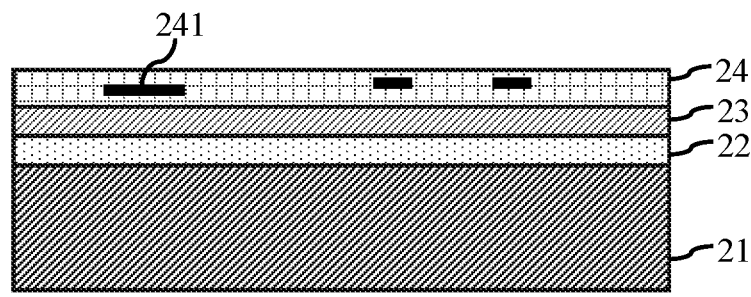
FIGS. 3a to 3i are schematic illustrations of intermediate structures in the method of fabricating the semiconductor device shown in FIG. 2.
Figure 3B:
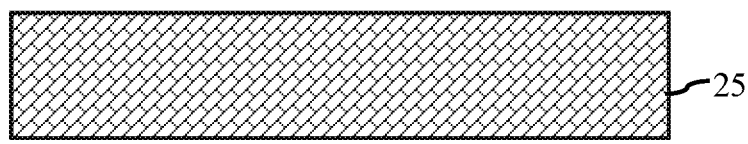

In step S1, with reference to FIGS. 3a and 3b, the device wafer including the SOI substrate including, stacked from the bottom upward, the lower substrate 21, the buried insulator layer 22 and the semiconductor layer 23, and the carrier wafer 25 are provided.

The lower substrate 21 and the semiconductor layer 23 may be both formed of any suitable semiconductor material. Examples of the semiconductor material may include, but are not limited to, silicon, germanium, silicon germanium, silicon germanium carbide, silicon carbide and other semiconductor materials. The buried insulator layer 22 may be, for example, a silicon oxide layer.

The lower substrate 21 is doped with a very high concentration of n-type or p-type ions, which lead to a very low resistivity of the lower substrate 21, for example, in the range of 8-10 $\Omega \cdot cm$.

In the semiconductor layer 23, there may be formed shallow trench isolation (STI) structures, sources, drains and other components.

The device wafer may further include an insulating dielectric layer 24 on the semiconductor layer 23, in which there may be formed metal interconnections 241, gates (not shown) and other structures.

When the device wafer is used to fabricate RF devices, due to the very low resistivity of the lower substrate 21, RF signals in the form of electromagnetic waves produced by the RF devices may propagate through the buried insulator layer 22 and reach the lower substrate 21. When this happens, voltages or currents tend to be induced, which may lead to signal loss and degraded signal linearity (i.e., signal distortion).

The carrier wafer 25 may not contain any functional component, and may serve only to support the device wafer. Alternatively, the carrier wafer 25 may also be a device wafer containing MOS transistors, resistors, capacitors, metal interconnections and other structures. The carrier wafer 25 may be silicon or any another suitable material. The present disclosure is not limited to any material or functionality of the carrier wafer 25.

Figure 3C:
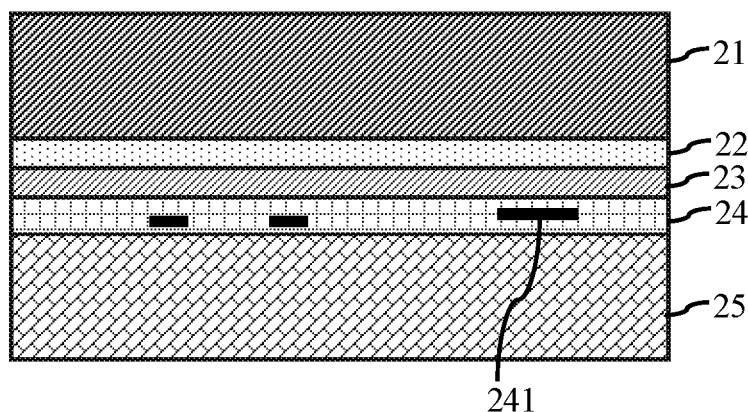

In step S2, with reference to FIG. 3c, the device wafer is bonded at its front side to the carrier wafer 25. The front side of the device wafer is the side of the insulating dielectric layer 24 farther away from the lower substrate 21.

The bonding of the device wafer to the carrier wafer 25 may be accomplished with a bonding adhesive. The bonding adhesive is configured mainly for maintaining the bonding of the device wafer and the carrier wafer 25. The bonding adhesive may be one selected from a wide range of adhesives including those curable by heat or ultraviolet (UV) radiation and those decomposable by heat or laser. Alternatively, before the device wafer is bonded at its front side to the carrier wafer 25, a first bonding layer (not shown) may be formed on the device wafer, and/or a second bonding layer (not shown) on the carrier wafer 25. In this case, the bonding of the device wafer to the carrier wafer 25 may be accomplished by means of the first bonding layer and/or the second bonding layer.

Figure 3D:
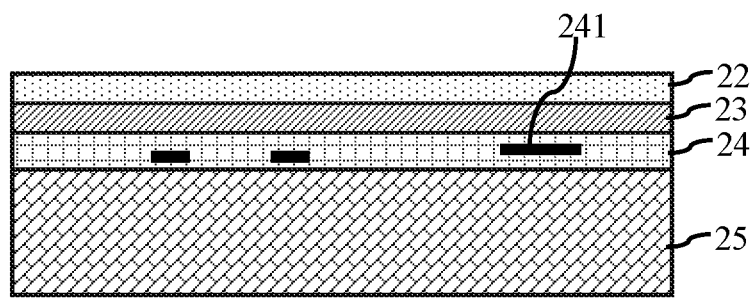

In step S3, with reference to FIG. 3d, the device wafer is thinned at the backside thereof to remove at least the lower substrate 21. The front of the device wafer opposes the back side of the device wafer.

As a result of the backside thinning of the device wafer, the lower substrate 21 of the SOI substrate may be removed, with the semiconductor layer 23 and the entire buried insulator layer 22 being retained. Alternatively, the lower substrate 21 and at least a partial thickness of the buried insulator layer 22 may be removed, with the semiconductor layer 23 and the remaining thickness of the buried insulator layer 22 being retained. Alternatively, only the semiconductor layer 23 may be retained.

The backside thinning of the device wafer may be accomplished with at least one of chemical mechanical polishing (CMP), dry etching and wet etching.

Figure 3E:
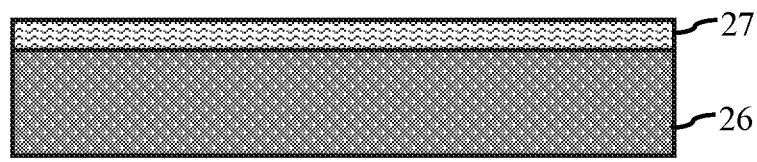
Figure 3F:
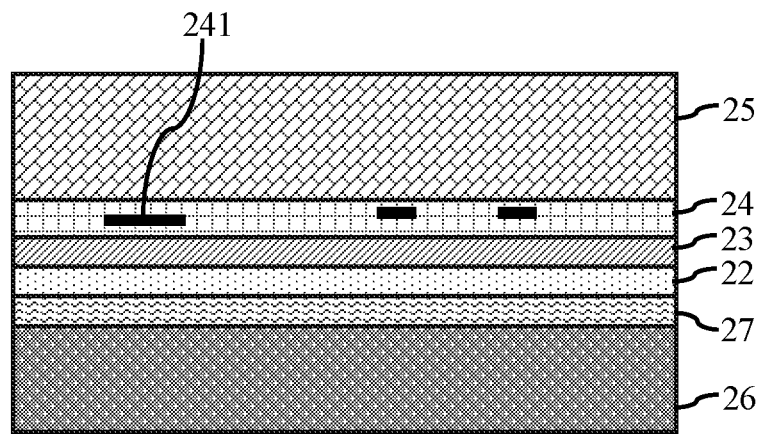

In step S4, with reference to FIGS. 3e and 3f, the high-resistance substrate 26 is provided and the device wafer is bonded at the backside thereof to the high-resistance substrate 26. The resistivity of the high-resistance substrate 26 is higher than that of the lower substrate 21.

If the semiconductor layer 23 and the buried insulator layer 22 or part thereof remain from the backside thinning of the device wafer, then the device wafer is bonded at its backside that is provided by the buried insulator layer 22 to the high-resistance substrate 26, as shown in FIG. 3f. If only the semiconductor layer 23 of the SOI substrate remains, then the device wafer is bonded at its backside that is provided by the semiconductor layer 23 to the high-resistance substrate 26.

Before the device wafer is bonded at its backside to the high-resistance substrate 26, bonding layers may be formed on the backside of the device wafer and on the high-resistance substrate 26, or a bonding layer may be formed on the backside of the device wafer or on the high-resistance substrate 26. In these cases, the bonding of the device wafer at its backside to the high-resistance substrate 26 may be accomplished by the bonding layer(s).

The high-resistance substrate 26 may be formed of a semiconductor material such as silicon, germanium, silicon germanium or silicon germanium carbide. The high-resistance substrate 26 may be doped with a very low concentration of n-type or p-type ions and has a very high resistivity that is, for example, 100 Ω·cm or higher. More preferably, the resistivity is 1000 Ω·cm or higher, which can impart even higher performance.

Alternatively, the high-resistance substrate 26 may be formed of an insulating material such as glass, quartz, sapphire or aluminum nitride, which imparts a very high resistivity to the high-resistance substrate 26.

Figure 3G:
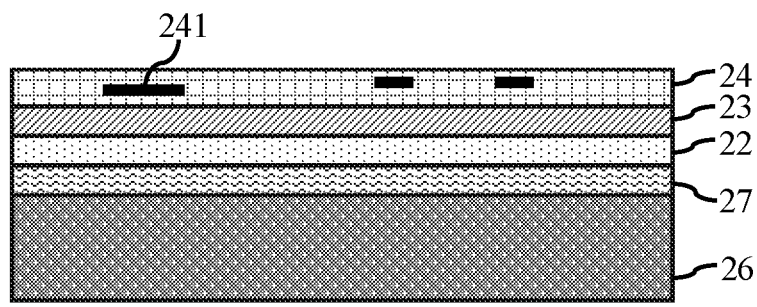
Figure 3H:
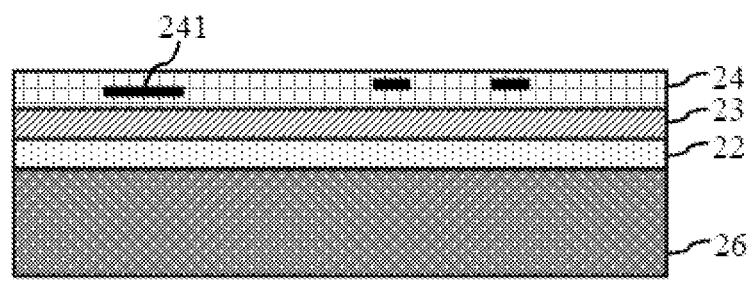

In case of the high-resistance substrate 26 being made of an insulating material, the polysilicon layer 27 may not be formed, as shown in FIG. 3h. In case of the high-resistance substrate 26 being made of a semiconductor material having a very high resistivity, a polysilicon layer 27 may be further formed on the high-resistance substrate 26. In this case, the device wafer may be bonded at its backside to the polysilicon layer 27 on the high-resistance substrate. The polysilicon layer 27 can better maintain the resistivity of the high-resistance substrate 26, allowing the portion under the semiconductor layer 23 to have an increased resistivity.

Figure 3I:
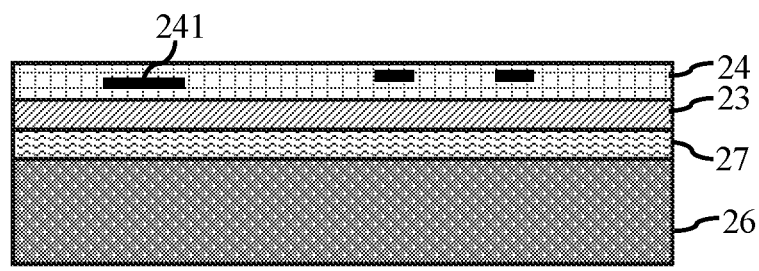

Referring to FIGS. 3g and 3i, the method may further include removing the carrier wafer 25 using a debonding process.

As shown in FIG. 3g, as a result of the removal of the carrier wafer 25, the semiconductor device is formed, which includes, stacked from the bottom upward, the high-resistance substrate 26, the polysilicon layer 27, the buried insulator layer 22 or part thereof, the semiconductor layer 23 and the insulating dielectric layer 24. Alternatively, as shown in FIG. 3i, the semiconductor device formed as a result of the removal of the carrier wafer 25 includes, stacked from the bottom upward, the high-resistance substrate 26, the polysilicon layer 27, the semiconductor layer 23 and the insulating dielectric layer 24.

If the device wafer is bonded to the carrier wafer 25 using the bonding adhesive in step S2, the carrier wafer 25 may be removed by decomposing the bonding adhesive by heat, UV radiation, a chemical solvent or any other suitable means depending on the type of the used bonding adhesive. If the device wafer is bonded to the carrier wafer 25 by means of the first bonding layer and/or the second bonding layer, the debonding may be accomplished using a mechanical force or another suitable means to enable the removal of the carrier wafer 25.

If the carrier wafer 25 is also a device wafer, it may not be debonded and removed from the carrier wafer 25. In this way, it may remain bonded to the device wafer to achieve desired device functionality together with the device wafer.

Figure 1A:
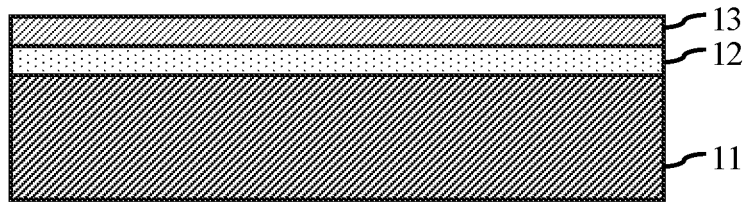
FIGS. 1a to 1b schematically illustrate an existing semiconductor-on-insulator (SOI) substrate.
Figure 1B:
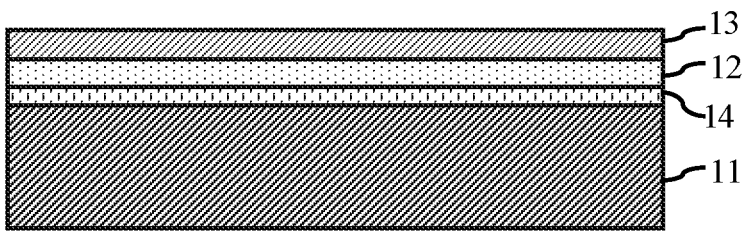

In this method, the device wafer is temporarily bonded at its front side to the carrier wafer and then thinned from the backside thereof to remove at least the lower substrate of the SOI substrate. Moreover, the device wafer is bonded at its backside to the high-resistance substrate. In this way, the lower substrate of the SOI substrate is replaced with the high-resistance substrate with a higher resistivity. Therefore, when the semiconductor device is an RF device, when RF signals that it produces in the form of electromagnetic waves propagate to the high-resistance substrate, weaker voltages or currents will be induced. In this way, reduced signal loss and improved signal linearity are achievable with the less expensive SOI substrate containing only the lower substrate, the buried insulator layer and the semiconductor layer (i.e., the structure shown in FIG. 1a), dispensing with the need to use a more expensive SOI substrate additionally including a polysilicon layer in addition to the lower substrate, the buried insulator layer and the semiconductor layer (i.e., the structure shown in FIG. 1b), i.e., avoiding a significant cost increase. Thus, the method can achieve lower signal loss and improved signal linearity of an RF device while avoiding a significant cost increase.

Further, in the case of the high-resistance substrate being made of a semiconductor material with a resistivity of 100 Ω·cm or higher, voltages or currents induced therein will be very weak, resulting in mitigation of signal loss and signal distortion. Furthermore, when the high-resistance substrate is made of an insulating material, no voltages or currents will be induced therein (because they can only be induced in a conductive material), resulting in elimination of signal loss and signal distortion.

In embodiments of the present disclosure, there is provided a semiconductor device including a high-resistance substrate having a high resistivity and a device wafer bonded to the high-resistance substrate. The device wafer includes a semiconductor layer and, optionally, a buried insulator layer that is closer to the high-resistance substrate than the semiconductor layer. This semiconductor device can be made using the method of the present disclosure as discussed above.

The semiconductor device will be described below in greater detail with reference to FIGS. 3g and 3i.

The high-resistance substrate 26 may be formed of a semiconductor material such as silicon, germanium, silicon germanium or silicon germanium carbide. The high-resistance substrate 26 may be doped with a very low concentration of n-type or p-type ions and has a very high resistivity that is, for example, 100 Ω·cm or higher. More preferably, the resistivity is 1000 Ω·cm or higher, which can impart even higher performance.

Alternatively, the high-resistance substrate 26 may be formed of an insulating material such as glass, quartz, sapphire or aluminum nitride, which imparts a very high resistivity to the high-resistance substrate 26.

In case of the high-resistance substrate 26 being made of a semiconductor material having a very high resistivity, a polysilicon layer 27 may be further formed on the high-resistance substrate 26 so as to be sandwiched between the high-resistance substrate 26 and the device wafer. The polysilicon layer 27 can better maintain the resistivity of the high-resistance substrate 26.

The device wafer is bonded to the high-resistance substrate 26. The device wafer includes the semiconductor layer 23, as shown in FIG. 3i. Alternatively, the device wafer includes the semiconductor layer 23 and the buried insulator layer 22 that is closer to the high-resistance substrate 26 than the semiconductor layer 23, as shown in FIG. 3g. The device wafer may be bonded to the high-resistance substrate 26 via a bonding layer.

The semiconductor layer 23 may be formed of any suitable semiconductor material. Examples of the semiconductor material may include, but are not limited to, silicon, germanium, silicon germanium, silicon germanium carbide, silicon carbide and other semiconductor materials. The buried insulator layer 22 may be, for example, a silicon oxide layer.

In the semiconductor layer 23, there may be formed shallow trench isolation (STI) structures, sources, drains and other components.

The device wafer may further include an insulating dielectric layer 24 on the semiconductor layer 23. In the insulating dielectric layer 24, there may be formed metal interconnections 241, gates (not shown) and other structures.

The semiconductor device may further include a carrier wafer bonded to the device wafer. The carrier wafer may also be a device wafer containing MOS transistors, resistors, capacitors, metal interconnections and other structures. The carrier wafer may be bonded to the device wafer via bonding layer(s).

As can be seen from the above-discussed structure of the semiconductor device, since the device wafer is bonded to the high-resistance substrate having a high resistivity, when the semiconductor device is an RF device, weaker voltages or currents will be induced in the high-resistance substrate by RF signals that the RF device produces in the form of electromagnetic waves. In this way, reduced signal loss and improved signal linearity are achievable.

Further, in the case of the high-resistance substrate being made of a semiconductor material with a resistivity of 100 Ω·cm or higher, voltages or currents induced therein will be very weak, resulting in mitigation of signal loss and signal distortion. Furthermore, when the high-resistance substrate is made of an insulating material, no voltages or currents will be induced therein (because they can only be induced in a conductive material), resulting in elimination of signal loss and signal distortion.

The foregoing description presents merely preferred embodiments of the present disclosure and is not intended to limit the scope of the present disclosure in any sense. It is intended that all changes and modifications made by those of ordinary skill in the art in light of the above teachings fall within the scope of the appended claims.

What is claimed is:

1. A method of fabricating a semiconductor device, comprising:
    providing a device wafer and a carrier wafer, the device wafer comprising a semiconductor-on-insulator substrate comprising, stacked from the bottom upward, a lower substrate, a buried insulator layer and a semiconductor layer;
    bonding the device wafer at a front side thereof to the carrier wafer;
    removing at least the lower substrate by thinning the device wafer from a backside thereof, wherein the backside of the device wafer opposes the front side of the device wafer; and
    providing a high-resistance substrate and bonding the thinned device wafer at the backside of the thinned device wafer to the high-resistance substrate, the high-resistance substrate having a resistivity higher than that of the lower substrate,
    wherein the high-resistance substrate is formed of a semiconductor material, a polysilicon layer is formed on the high-resistance substrate, and the thinned device wafer is bonded at the backside of the thinned device wafer to the polysilicon layer.

2. The method of claim 1, wherein the resistivity of the lower substrate ranges from 8 Ω·cm to 10 Ω·cm.

3. The method of claim 1, wherein the lower substrate is removed, or the lower substrate and at least a partial thickness of the buried insulator layer are removed by thinning the device wafer from the backside thereof.

4. The method of claim 1, wherein the resistivity of the high-resistance substrate is 100 Ω·cm or higher.

5. The method of claim 1, further comprising removing the carrier wafer using a debonding process.

6. The method of claim 1, wherein the bonding of the device wafer at a front side thereof to the carrier wafer is accomplished with a bonding adhesive.

7. The method of claim 1, wherein before the device wafer is bonded at the front side thereof to the carrier wafer, a first bonding layer is formed on the device wafer, and/or a second bonding layer is formed on the carrier wafer, the bonding of the device wafer to the carrier wafer is accomplished by means of the first bonding layer and/or the second bonding layer.

8. The method of claim 1, wherein the thinning of the device wafer is accomplished with at least one of chemical mechanical polishing, dry etching and wet etching.

9. The method of claim 1, wherein before the device wafer is bonded at the backside of the thinned device wafer to the high-resistance substrate, bonding layers are formed on the backside of the thinned device wafer and on the high-resistance substrate, or a bonding layer is formed on the backside of the thinned device wafer or on the high-resistance substrate, the bonding of the thinned device wafer at the backside of the thinned device wafer to the high-resistance substrate is accomplished by the bonding layers.

* * * * *